United States Patent
Lin et al.

(10) Patent No.: US 6,302,306 B1
(45) Date of Patent: *Oct. 16, 2001

(54) METHOD AND APPARATUS FOR DISPENSING VISCOUS MATERIAL

(75) Inventors: Jeff Jin Her Lin, Canton; John Trublowski, Troy; Vinh Van Ha, Southfield, all of MI (US)

(73) Assignee: Visteon Global Tech., Inc., Dearborn, MI (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/358,981

(22) Filed: Jul. 22, 1999

Related U.S. Application Data

(63) Continuation-in-part of application No. 08/716,037, filed on Sep. 19, 1996, which is a continuation of application No. 08/363,806, filed on Dec. 27, 1994, now abandoned.

(51) Int. Cl.[7] .................................................. B67D 5/42
(52) U.S. Cl. ...................................... 222/386.5; 222/399
(58) Field of Search ................................. 222/386.5, 399

(56) References Cited

U.S. PATENT DOCUMENTS

| | | | |
|---|---|---|---|
| 4,622,239 | 11/1986 | Schoenthaler et al. | 427/96 |
| 4,720,402 | 1/1988 | Wojcik | 427/282 |
| 4,784,652 | 11/1988 | Wikstroem . | |
| 5,096,092 | * 3/1992 | Devine | 222/386.5 |
| 5,133,120 | 7/1992 | Kawakami et al. | 29/852 |
| 5,191,709 | 3/1993 | Kawakami et al. | 29/852 |
| 5,405,054 | * 4/1995 | Thomas | 222/146.6 |
| 5,435,462 | 7/1995 | Fujii . | |
| 5,772,079 | * 6/1998 | Gueret | 222/386.5 |

FOREIGN PATENT DOCUMENTS

| | | | |
|---|---|---|---|
| 3708396 | * 10/1987 | (DE) | 222/386.5 |
| 0 839 758 | 5/1998 | (EP) . | |
| 93 11059 | 6/1993 | (WO) . | |

OTHER PUBLICATIONS

PCT International Search Report.

* cited by examiner

*Primary Examiner*—Joseph A. Kaufman
(74) *Attorney, Agent, or Firm*—VisteonGlobal Tech.

(57) ABSTRACT

A novel apparatus for compressing viscous material through openings in a stencil is disclosed. The novel apparatus has a compression head cap which provides a contained environment to direct and to aid the flow of pressurized viscous material through the openings in the stencil. The apparatus further includes a selectively expandable diaphragm which selectively and expandably allows the viscous material to be dispensed into the compression head cap.

11 Claims, 9 Drawing Sheets

METHOD AND APPARATUS FOR DISPENSING VISCOUS MATERIAL

This application is a continuation in part from pending U.S. patent application Ser. No. 08/716,037 (filed Sep. 19, 1996), which is a continuation of U.S. patent application Ser. No. 08/363,806 (filed Dec. 27, 1994, and now abandoned).

BACKGROUND OF THE INVENTION

1. Field of the Invention

Embodiments of the present invention relate generally to methods and devices for depositing viscous materials onto a printed wiring board. In one aspect, the present invention relates to methods and devices for compressing viscous materials, such as solder paste, through openings in a perforated substrate, such as a patterned screen or stencil.

2. Description of Related Art

Surface Mount Technology (SMT) involves placing circuit components onto circuit paths embedded on the upper surface of a printed wiring board and then soldering the components in place by a process called "reflow soldering". Before the circuit component is placed on the printed wiring board, however, it is desirable to apply solder paste to the area on the printed wiring board where the component is to be soldered into place.

Conventional methods do exist to deposit ("print") solder paste onto desired areas of a printed wiring board by forcing the paste through openings in a substrate (e.g., a stencil) placed in intimate contact with the printed wiring board.

U.S. Pat. No. 4,622,239 describes such a method and device for dispensing viscous materials. The method includes forcing a viscous material from a housing through an opening and depositing it onto a stencil between a pair of flexible members (parallel squeegee blades) which depend from the housing on either side of the opening and are in contact with the stencil. The ends of the flexible members are not connected and remain open ended. The viscous material, accordingly, is not contained within an enclosed area when it is deposited on the surface of the stencil. Movement of the housing and the flexible members horizontally across the stencil causes the trailing flexible member to force the viscous material through the openings in the stencil. U.S Pat. No. 4,720,402 describes a similar method and device except that the leading flexible member is raised off of the stencil during movement of the housing.

U.S. Pat. Nos. 5,133,120 and 5,191,709 describe methods for filling through-holes of a printed wiring board via a mask with pressurized conductive filler material by means of a nozzle assembly unit having a nozzle tip member. The nozzle tip member, however, is designed only to dispense the pressurized conductive filler material through the mask to a single through-hole. The nozzle tip member then "scans" the printed wiring board for a second through-hole to fill. The nozzle tip member has a blunt end section which rests on the mask and a circular exit, the diameter of which may be increased or decreased by changing the nozzle tip member. The nozzle tip member dispenses the filler material without controlling unwanted flow of "excessive" filler material back through the stencil. Additionally, the nozzle tip member does not define a contained environment where "compression" of the filler material takes place through the mask followed by the immediate shearing off of the filler material within that contained environment from the surface of the stencil. In fact, the nozzle tip member itself provides no effective means for shearing off filler material from the top of the stencil, rather, after the through hole is filled and filler material "backs up" through the stencil, the nozzle tip member moves forward whereupon the "excessive" filler material is then wiped off by a separate, single, flexible squeegee member which is designed for unidirectional use only.

Unfortunately, these conventional efforts do not provide a contained environment for compression of viscous material through holes in a stencil and shearing of viscous material within the contained environment from the upper surface of the stencil. Reliance upon squeegee movement to force the viscous material, such as solder paste, through the stencil openings can lead to damage and eventual failure of both the squeegee blades and the stencil due to repeated friction. Since conventional efforts do not provide a contained environment in which compression and shearing is accomplished, waste of the viscous material is frequently encountered.

Conventional efforts, therefore, (1) fail to maximize the efficiency of printing solder paste onto a desired area of a printed wiring board and (2) fail to minimize waste of the solder paste during the printing process. A need therefore exists to develop a method for printing solder paste onto a printed wiring board and a device suitable for use therewith which overcomes the deficiencies of the conventional efforts.

Other methods which utilize a pneumatically driven piston, or a direct injection or application of air or other gasses, to force viscous material from a syringe, have several drawbacks. For example, air or other gases which are used to directly expel the paste or viscous material from the container, or which are used to selectively move a piston, oftentimes cause undesirable voids in material. Moreover, in order to selectively expel the entire contained quantity of the viscous material from the syringe, the stroke of the pneumatically driven piston must be substantially as long as the syringe. The use of relatively small and inexpensive conventional pistons therefore requires the concomitant use of many short syringes which must be frequently replaced and/or re-filled, thereby undesirably increasing production time and concomitantly decreasing production efficiency. The use of longer more expensive pistons allows for the use of larger syringes containing more viscous material and requiring less frequent replacement and/or re-filling. However, these large pistons are relatively heavy, thereby requiring costly and undesirable structural modifications to the compression head, are difficult to package, and/or are difficult and/or awkward to replace.

The present invention is directed at eliminating the need for a pneumatically driven piston while allowing for the selective distribution of a relatively large amount of viscous material.

SUMMARY OF THE INVENTION

The present invention includes a novel apparatus and method for dispensing viscous material through openings in a stencil. Embodiments of the present invention include a process herein referred to as "compression printing" wherein pressure is applied to a viscous material within a contained environment defined by a compression head cap so as to compress it through openings in a stencil.

The apparatus of the present invention includes a reservoir containing viscous material which is operably connected to a pressure source. The reservoir is in fluid communication with a housing which terminates in a substantially uniform opening defined by a compression head cap formed from contiguous walls. During operation of the apparatus, the compression head cap is placed in contact with a stencil having a plurality of openings therein. The compression head cap and the stencil form a contained environment. The pressure source then applies pressure against the viscous material contained in the reservoir forcing it from the reservoir into the housing and to the compression head cap. The contiguous walls of the compression head cap act to contain and to direct flow of the pressurized viscous material to the top surface of the stencil and then through the openings in the stencil.

It is accordingly an object of the present invention to provide a novel apparatus for compressing a viscous material through openings in a stencil by means of a pressure source. It is a further object of the present invention to increase the efficiency of printing viscous material onto a desired area of a printed wiring board and to minimize waste of the viscous material during the printing process.

According to another object of the present invention, an apparatus is provided for selectively dispensing viscous material. The apparatus includes a selectively expandable diaphragm which selectively and expandably causes said contained viscous material to be dispensed.

According to yet another object of the present invention, a method to selectively dispense viscous material is provided. The method includes the steps of providing the viscous material; placing the provided viscous material within a container having a dispensing aperture; placing a member over the contained viscous material; providing a selectively inflatable diaphragm in close proximity to the member; and selectively inflating the diaphragm effective to selectively move the member within the container, thereby causing the member to force at least a portion of the contained viscous material through the dispensing aperture.

Other objects, features or advantages of the present invention will become apparent from the following description taken in conjunction with the accompanying drawings.

BRIEF DESCRIPTION OF THE DRAWINGS

In the course of the detailed description of certain preferred embodiments to follow, reference will be made to the attached drawings, in which.

DESCRIPTION OF CERTAIN PREFERRED EMBODIMENTS

The principles of the present invention may be applied with particular advantage to obtain an apparatus for compressing a viscous material through openings in a stencil, preferred embodiments of which may be seen at FIGS. 1, 2, 3, 4, and 5 which are described more fully below.

Figure 1:
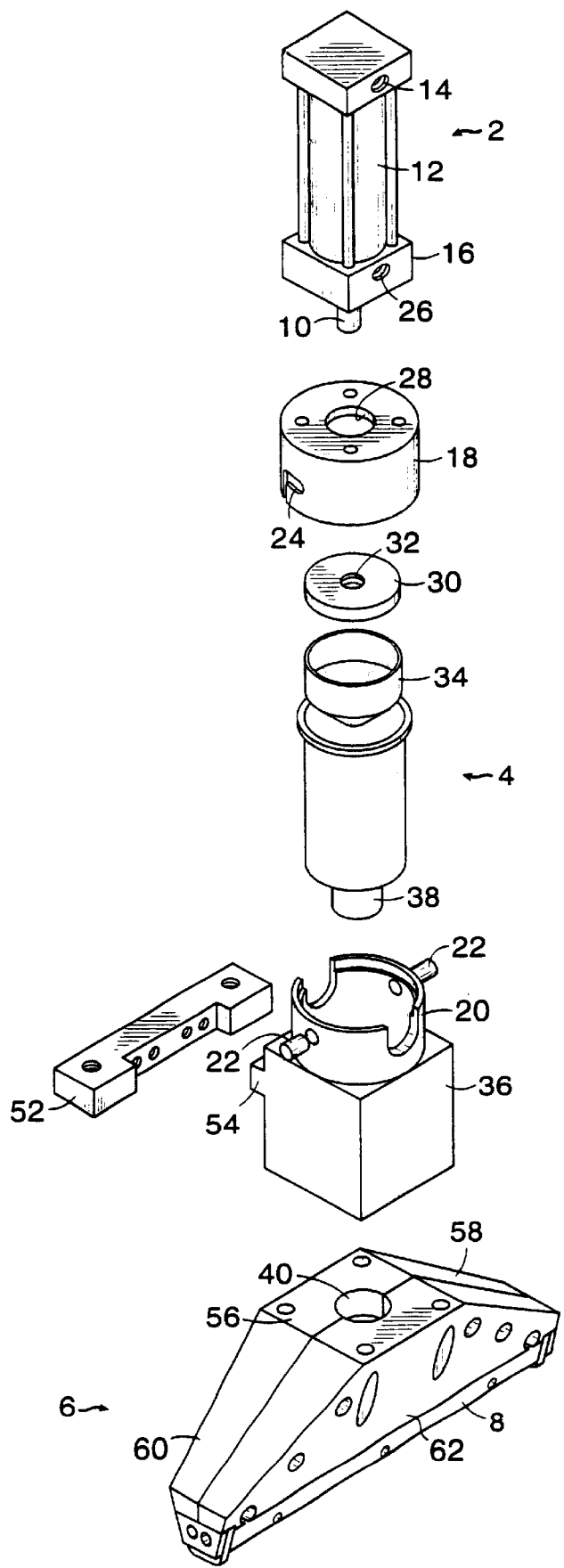
FIG. 1 is a perspective view of the apparatus of the present invention, partially exploded.

FIG. 1 is a partially exploded perspective view of one embodiment of the apparatus of the present invention. As can be generally seen at FIG. 1, the apparatus has a pressure source 2 which is operably connected to a reservoir 4 containing a supply of a viscous material, a compression head 6 and a compression head cap 8.

More particularly, FIG. 1 shows a pressure source depicted as an air cylinder 2 having a piston (not shown) connected to a rod 10 contained in a cylinder housing 12. Pressure inlet 14 allows for the introduction of air pressure at the top of air cylinder 2 thereby displacing the piston causing piston rod 10 to move downward. The air cylinder 2 is mounted via base 16 to cylinder mount 18 which in turn is removably mounted to casing 20 via a twist socket connector having posts 22 and socket grooves, one of which is shown at 24. Base 16 has air inlet 26 for the introduction of air pressure at the bottom of air cylinder 2 thereby displacing the piston causing piston rod 10 to move upward.

Piston rod 10 extends through opening 28 of cylinder mount 18 and is fixedly connected to syringe pusher 30 at contact 32 which in turn engages displacement piece 34 which is movably disposed within syringe 4 which contains a viscous material. Displacement piece 34 acts as a plunger and is designed to mate with the interior of syringe 4 to ensure effective displacement of viscous material with minimal waste. Pressure source 2 is designed to mechanically meter out viscous material through operation of the syringe pusher 30 on the displacement piece 34. The syringe pusher 30, displacement piece 34 and syringe 4 are all vertically housed in operative fashion within the cylinder mount 18, the casing 20 and the syringe housing 36.

The vertical arrangement of the pressure source 2 and the syringe 4 containing the viscous material is a preferred arrangement which advantageously provides for even and direct pressure in metering out the viscous material onto the top surface of a stencil. It is to be understood that pressure source 2 is not limited to an air cylinder of the type depicted in FIG. 1, but that other suitable pressure sources may be used by one of ordinary skill in the art based upon the teachings of the present invention. Such pressure sources include those which mechanically, electrically, or hydraulically operate a mechanical force, such as a piston rod and displacement piece, to meter out viscous material from a syringe housing or other reservoir which contains viscous material. In addition, pneumatic pressure may be used directly to force viscous material from a reservoir housing. Also, pressure source and reservoir configurations other than the vertical configuration depicted in FIG. 1 are useful in the present invention. Such configurations include side mounted reservoirs and pressure sources or other configurations readily known to those skilled in the art.

The syringe 4 is preferably a disposable unit which can be replaced when desired by disconnecting cylinder mount 18 from casing 20 via the twist socket connector, removing the syringe and replacing it with an alternate syringe. Examples of disposable syringes useful within the teachings of the present invention include those which are readily commercially available from Methods Engineering, Vauxhall, N.J. The cartridges may be purchased prefilled with suitable viscous materials or they may be purchased empty and then filled with suitable viscous materials, such as solder pastes, which are useful within the practice of the present invention. Useful solder pastes may be readily commercially available from Alpha Metals, Jersey City, N.J.

Typical solder pastes useful with surface mount technology generally contain an alloy of tin, lead and silver in various proportions in combination with other useful solder paste metals, viscosity agents, flux and/or solvents depending upon the desired use of the solder paste. Solder pastes useful in the present invention will become apparent to one of ordinary skill in the art based upon the teachings herein.

Figure 2:
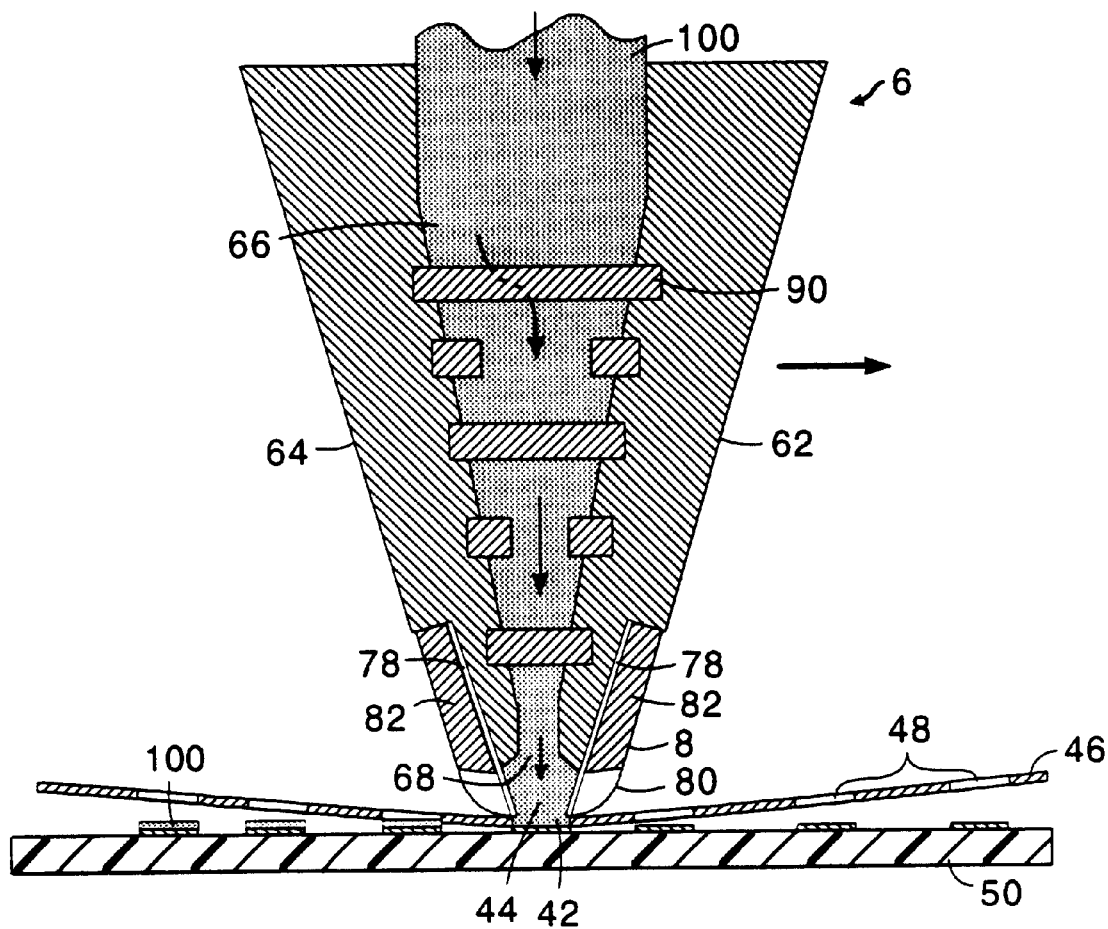
FIG. 2 is a side cross-sectional view of a compression head, a compression head cap, a stencil and a printed wiring board of the present invention showing movement of the solder paste through the compression head, the compression head cap and the openings of the stencil onto the printed wiring board.

The syringe housing 36 is mounted to a housing referred to herein as a compression head generally depicted at 6 in FIG. 1 and shown in a cross-sectional side view in FIG. 2. The syringe 4 has flange opening 38 which is inserted into and mates with first opening 40 of compression head 6 which is described hereafter with reference to both FIGS. 1 and 2 and FIG. 3 which is a bottom perspective view of the compression head cap 8, partially broken away. The compression head 6 terminates in a substantially uniform second opening 42 which is defined by compression head cap 8. The compression head cap 8 is formed from contiguous walls which define a volume 44 within compression head cap 8. The contiguous walls may be either unitary or formed from separate elements and are designed to contact stencil 46 to provide a uniform and substantially flush union with stencil 46 at the point of contact. As can be seen in FIG. 2, stencil 46 has openings 48 and is placed in an operable relationship with a printed wiring board 50. The stencil 46 may be placed in intimate contact with printed wiring board 50 or, as shown in FIG. 2, it may be placed a distance above printed wiring board 50 such that pressure from the compression head 6 forces the stencil 46 into contact with printed wiring board 50. Although stencil 46 is shown in cross-section, it is to be understood that openings 48 may have any desired orientation on stencil 46. Further openings 48 may differ in size depending upon the area of the printed wiring board 50 to be printed with the viscous material. The compression head cap 8 and stencil 46 together form a contained environment 44 for the viscous material during operation of the apparatus of the present invention.

As can be seen in FIG. 1, cross bar mount 52 is attached to syringe housing 36 via flange 54. Cross bar mount 52 is also attached to a mechanism (not shown) for horizontally displacing the apparatus of the present invention along the stencil 46.

The compression head 6 is preferably formed from metal, such as iron or stainless steel or other material suitable for use with pressurized viscous material. The compression head 6 has top surface 56 which serves as the base to which the syringe housing 36 is attached. Side surfaces 58 and 60 extending from top surface 56 slope away from each other as depicted in FIG. 1 to define an increasing length of compression head 6. Front and back surfaces 62 and 64 are contiguous with side surfaces 58 and 60 and slope toward each other as depicted in FIG. 2 to define a decreasing width of compression head 6. The side surfaces join with the front and back surfaces to define a tapered interior chamber 66 as shown in FIG. 2 which acts to restrict flow of viscous material through compression head 6. Interior chamber 66 terminates in generally rectangular exit 68. Compression head 6 preferably acts as a nozzle to direct and constrict the flow of viscous material through generally rectangular exit 68. The compression head cap 6 defines a volume 44 surrounding the rectangular exit 68 and into which viscous material flows after exiting the interior chamber 66 of compression head 6. As shown in FIG. 2, the volume 44 is preferably a separate chamber into which the viscous material flows after exiting the interior chamber 66 via rectangular exit 68. The compression head cap 8 defines a generally rectangular opening 42 which is to be contacted with stencil 48. The compression head cap 8 acts to contain and direct the flow of viscous material to the stencil 46. In an alternate embodiment, it is to be understood that the interior chamber 66 may terminate directly into compression head cap 8 without the need for rectangular exit 68 or volume 44.

Figure 3:
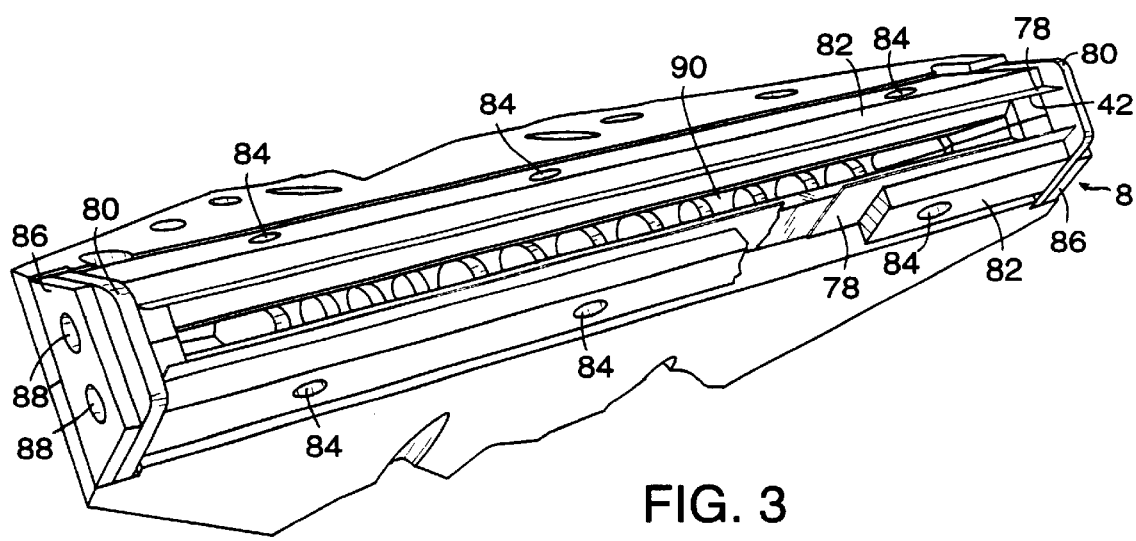
FIG. 3 is a bottom perspective view of the compression head cap of the present invention, partially broken away.
Figure 4:
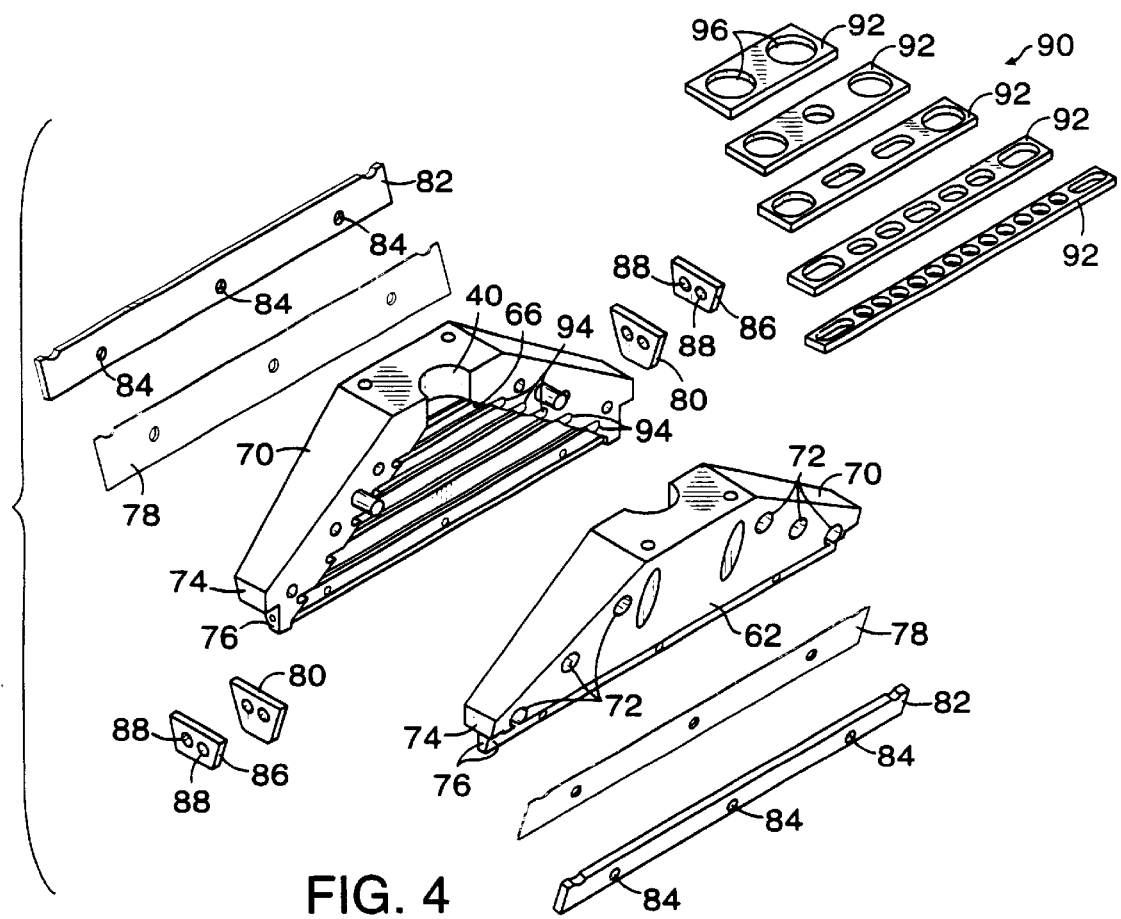
FIG. 4 is an exploded perspective view of the compression head of the present invention showing components of the compression head cap and one embodiment of a diffuser of the present invention.

As can be seen in FIG. 4, the compression head 6 has two half sections 70 which are fixedly connected by screws (not shown) via screw holes 72. The bottom side section 74 of each half section 70 is provided with ledge area 76 to engage the compression head cap 8. As depicted in FIGS. 2, 3 and 4, compression head cap 8 has rectangular blades 78 and end caps 80, which define generally rectangular opening 42. Blades 78 are each fixedly mounted to a corresponding ledge area 76 of front surface 62 and back surface 64, respectively, by means of corresponding rectangular blade holders 82 and screws (not shown) via screw holes 84. Blades 78 each extend along substantially the entire length of corresponding ledge area 76. End caps 80 are attached to a corresponding ledge area 76 of bottom side section 74 via corresponding cap mounts 86 and screws (not shown) via screw holes 88. The end caps 80 are contiguous with blades 78 and together form the compression head cap 8. As can be seen more clearly in FIG. 2, blades 78 parallel the slope of corresponding front and back surfaces 62 and 64, and are, therefore, seen to be angled inward relative to the interior chamber 66 of compression head 8.

Blades 78 are preferably thin and formed from rigid material such as iron or stainless steel. End caps 80 are preferably formed from a flexible substance such as polyurethane to avoid damage to the stencil during operation of the apparatus of the present invention. Cap mounts 86 and blade holders 82 are formed from any solid material capable of securing the corresponding end cap or blade.

While the compression head cap 8 is depicted in FIGS. 2, 3, and 4 as being formed from integral parts, it is to be understood that compression head caps having a unitary structure are within the teachings of the present invention. Such unitary compression head caps are formed from a single rectangular shaped unit and are designed to encircle the ledge area 76 of the compression head 6 or otherwise operatively engage compression head 6. Such compression head caps may be either fixed or removably mounted to the compression head and may have various sizes of opening 42.

The compression head 6 and compression head cap 8, in combination with the pressure source 2 and syringe 4 advantageously provide a vertical down force to move the viscous material evenly and directly to the stencil. The compression head cap 8 of the present invention advantageously provides a contained environment to direct and to aid in the extruding of pressurized viscous material through openings in the stencil. The extruded viscous material is then deposited on the pattern of the printed wiring board. The apparatus of the present invention provides for very high speed printing capability while maintaining print definition and reduced cycle time. Waste of viscous material is minimized due to the contained environment provided by the compression head cap 8. The length of the compression head cap 8 allows for simultaneous compression printing through a plurality of openings 48 in stencil 46. Furthermore, the trailing blade 78 relative to the direction of operation advantageously operates to shear off the viscous material contacting the stencil within the compression head cap 8 when the apparatus of the present invention is horizontally disposed across the stencil. The blades 78 are rigid and angled to advantageously achieve a smooth shearing of the viscous material. The compression head 6 and compression head cap 8 are advantageously rectangular in shape so that they may operate over a significant area of the stencil with each pass. Additionally, given the dual blade design of the compression head cap 8, the apparatus of the present invention may operate in both the forward and reverse directions thereby improving the efficiency of the compression printing process of the present invention.

As can be further seen in FIGS. 2 and 4, compression head 6 has diffuser 90 which is fixedly mounted within interior chamber 66. Diffuser 90 has a plurality of diffuser plates 92 which are horizontally disposed within interior chamber 66 via grooves 94. Each diffuser plate 92 has a series of openings 96 through which viscous material is to flow. Each opening 96 may be either circular or oblong and decreases in average size as the diffuser plates progress from the first opening 40 to the compression head cap 8. The openings 96 also increase in number as the diffuser plates progress from the first opening 40 to the compression head cap 8. The diffuser 90 advantageously serves to break up the flow of viscous material and evenly and uniformly distribute it from side to side of the rectangular exit 42. The diffuser 90 may also serve to reduce the velocity of the viscous material flowing through the compression head and increase the static pressure of the viscous material which aids in the compression printing process.

Figure 5:
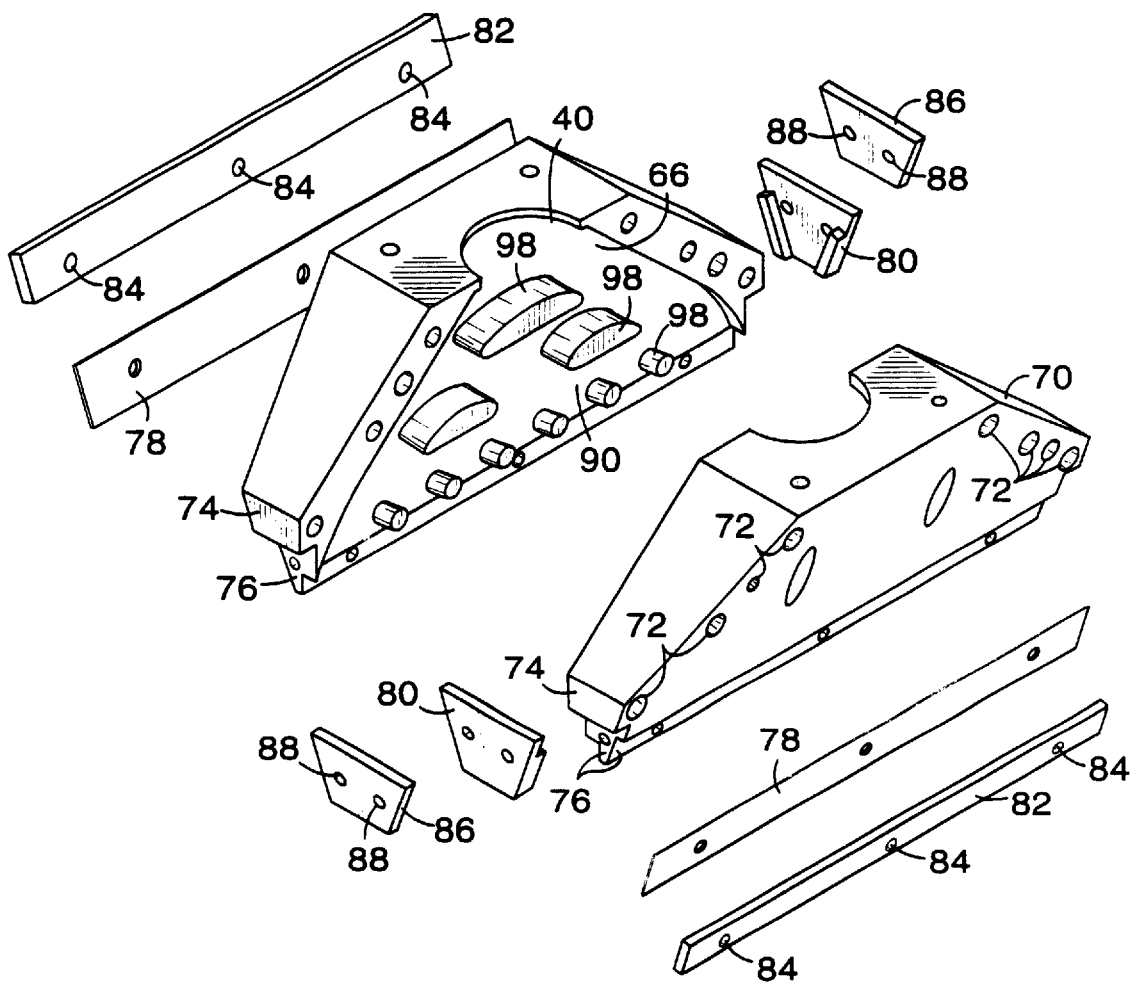
FIG. 5 is an exploded perspective view of the compression head of the present invention showing components of the compression head cap and a second embodiment of a diffuser of the present invention.
Figure 6:
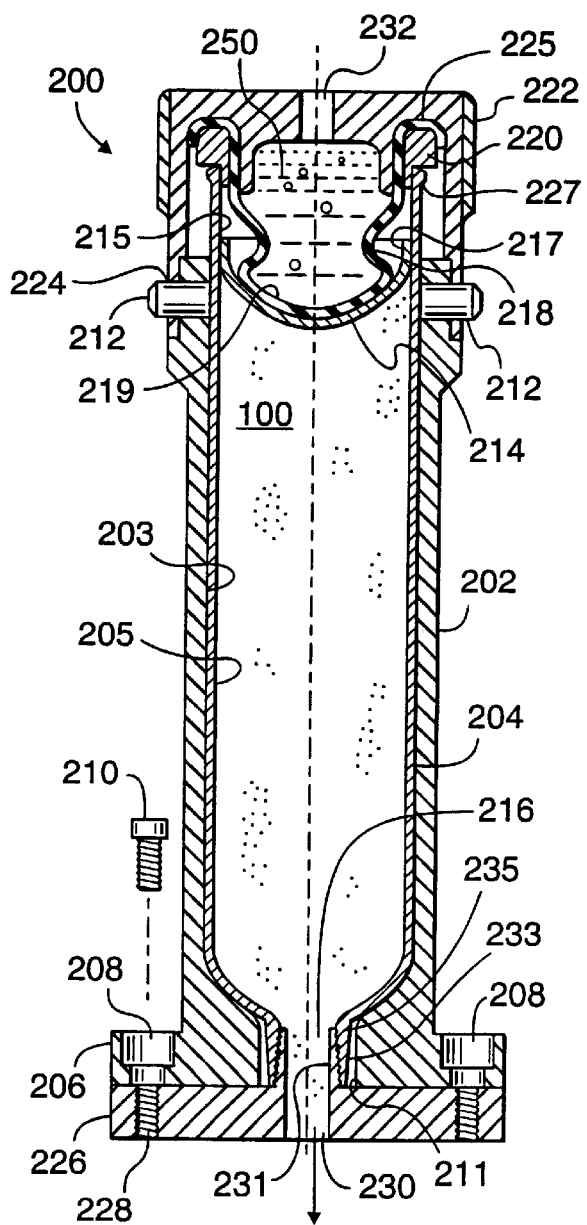
FIG. 6 is a cross-sectional view of a viscous material dispenser made in accordance with the teachings of a second embodiment of the invention and having a selectively expandable diaphragm which is shown in a selectively contracted position.

FIG. 5 shows an alternate embodiment of a diffuser 90 useful in the present invention. The diffuser 90 has a plurality of diffuser islands 98 which are horizontally disposed in rows within interior chamber 66. The diffuser islands 98 may be fixedly installed within the interior chamber 66 or they may be molded directly within the interior chamber 66. As with the diffuser 90 of FIG. 4, each diffuser island 98 acts to break up the flow of the viscous material and uniformly and evenly distribute it from side to side of rectangular exit 42. The diffuser islands may be either circular or oblong and decrease in average size as the rows progress from the first opening 40 to the compression head cap 8. The diffuser islands 98 also increase in number as the rows progress from the first opening 40 to the compression head cap 8. The diffuser islands 98 of the present invention are advantageous in that they provide for ease of fabrication of the compression head and ease of cleaning.

Operation of the apparatus of the present invention is now described as follows with reference to FIGS. 1 and 2. When compression printing according to the teachings of the present invention, the compression head cap 8 of the apparatus of the present invention is brought into contact with the top surface of stencil 46 which forces the stencil downward until it is in intimate contact with the printed wiring board below as shown in FIG. 2. The apparatus is then moved in a horizontal direction, as shown in FIG. 2, across the stencil 46.

During movement of the stencil, pressure source 2 acts on syringe 4 to force viscous material 100 from the syringe 4 into the interior chamber 66 of compression head 6 where it is diffused by diffuser 90 and directed to rectangular exit 68. The viscous material then enters volume 44 of compression head cap 8 which provides a contained environment via blades 78 and end caps 80 to direct the pressurized viscous material under pressure to the top surface of stencil 46. The viscous material is then extruded through openings 48 in the stencil 46 over which the compression head cap 8 travels. The extruded viscous material 100 is thereby printed on the printed wiring board 50. Movement of the compression head cap 8 across the stencil surface causes the trailing blade 78 which is angled inwardly relative to the interior chamber 66 to shear off the viscous material from the top surface of stencil 46. Once the apparatus has traversed the length of the stencil, the apparatus may simply reverse its direction and continue the compression printing process since the compression head cap 8 has dual blades 78 to accomplish the shearing process in either direction of movement.

Operating variables of the apparatus of the present invention, such as run speed and pressure, may be adjusted to accommodate either viscous materials having a wide range of viscosities or stencils with holes having a wide range of diameters. The following data in Table 1 is representative of the parameters at which the apparatus has successfully operated. Print speed is measures in inches per second, air pressure is measured in pounds per square inch, viscosity of the solder paste is measured in centipoises per second, stencil apertures are measured in inches, and the particle sizes of the solder pastes used are between 10–37 microns.

TABLE 1

| Print Speed (inches/sec.) | | Air Pressure | Viscosity (cps) | | Aperture (inches) | |
| --- | --- | --- | --- | --- | --- | --- |
| Low | High | (psi) | Low | High | Low | High |
| 0.94 | 1.26 | 20 | 850 K | 1.0 M | 0.0055 | >0.025 |
| 1.45 | 1.70 | 20 | 850 K | 1.0 M | 0.0055 | >0.025 |
| 2.27 | 2.31 | 20 | 850 K | 1.0 M | 0.0055 | >0.025 |
| 3.10 | 3.89 | 30 | 850 K | 1.0 M | 0.0055 | >0.025 |
| 4.20 | 4.77 | 30 | 850 K | 1.0 M | 0.0055 | >0.025 |
| 5.98 | 6.62 | 40–50 | 850 K | 1.0 M | 0.0075 | >0.025 |

TABLE 1-continued

| Print Speed (inches/sec.) | | Air Pressure | Viscosity (cps) | | Aperture (inches) | |
|---|---|---|---|---|---|---|
| Low | High | (psi) | Low | High | Low | High |
| 6.69 | 7.23 | 50–60 | 850 K | 1.0 M | 0.0075 | >0.025 |
| 7.70 | 12 | 50–60 | 850 K | 1.0 M | 0.0075 | >0.025 |

As indicated by the above data, the apparatus of the present invention successfully operated over a wide range of print speeds, air pressures and stencil openings. The compression printing method disclosed herein advantageously provides for quicker print speeds, better quality of printing, and less waste of solder paste material than is encountered with conventional printing methods.

While the above-delineated invention provides significant improvement over prior dispensers and dispensing methods, it has several drawbacks. Particularly, the stroke of the pneumatically driven piston must be substantially as long as the syringe in order to selectively expel the entire contained quantity of the viscous material from the syringe. The use of relatively small and inexpensive conventional pistons therefore requires the concomitant use of many short syringes which must be frequently replaced and/or "re-filled", thereby undesirably increasing production time and concomitantly decreasing production efficiency. The use of longer more expensive pistons allows for the use of larger syringes which contain more viscous material and require less frequent replacement and/or "re-filling" of material. However, these large pistons are relatively heavy, thereby requiring the compression head to be undesirably and structurally modified and "strengthened" in order to accommodate the increased piston weight. These large pistons are also difficult to package and are difficult and awkward to replace and service.

These drawbacks are addressed by the following additional embodiments which substantially eliminate the need for a pneumatically driven piston or air cylinder 2 and which allow for the selective distribution of a relatively large amount of contained material.

Referring now to FIGS. 6 through 9, there is shown an apparatus 200 which selectively dispenses viscous material and which is made in accordance with the teachings of a second embodiment of the invention.

Apparatus 200 includes a substantially cylindrical and generally hollow elongated housing 202 containing a substantially uniform cavity 203 having a generally circular cross-sectional area. Housing 202 is manufactured from a relatively strong and durable conventional and commercially available material, such as plastic or metal, and further includes an integrally formed base or flange portion 206 having four substantially identical openings or apertures 208 which are each adapted to selectively receive a conventional fastener or screw 210. Cavity 203 terminates within portion 206 by forming a relatively small and generally circular material dispensing aperture 211. Housing 202 further includes two opposing and laterally extending connector posts 212, which are used to selectively allow cap 222 to be removably secured upon the housing 202.

Apparatus 200 further includes a generally flat mounting member 226 having four substantially identical apertures 228 which are each adapted to be selectively and communicatively aligned with a unique one of the apertures 208 and to selectively receive a unique one of the fasteners 210.

Apertures 208, 228 and fasteners 210 cooperatively and selectively allow housing 202 to be selectively mounted upon a compression printing head. Mounting member 226 further forms and/or includes an aperture or channel 230 and an integrally formed and generally circular raised projection portion 231 which is adapted to be operatively inserted within the aperture 211 and which cooperates with the interior surface of housing 202 to form a generally circular retention groove 233. Aperture 230 communicates with cavity 203, through aperture 211, and selectively receives and directs the flow of viscous material to the compression head in a manner which will be explained.

Figure 7:
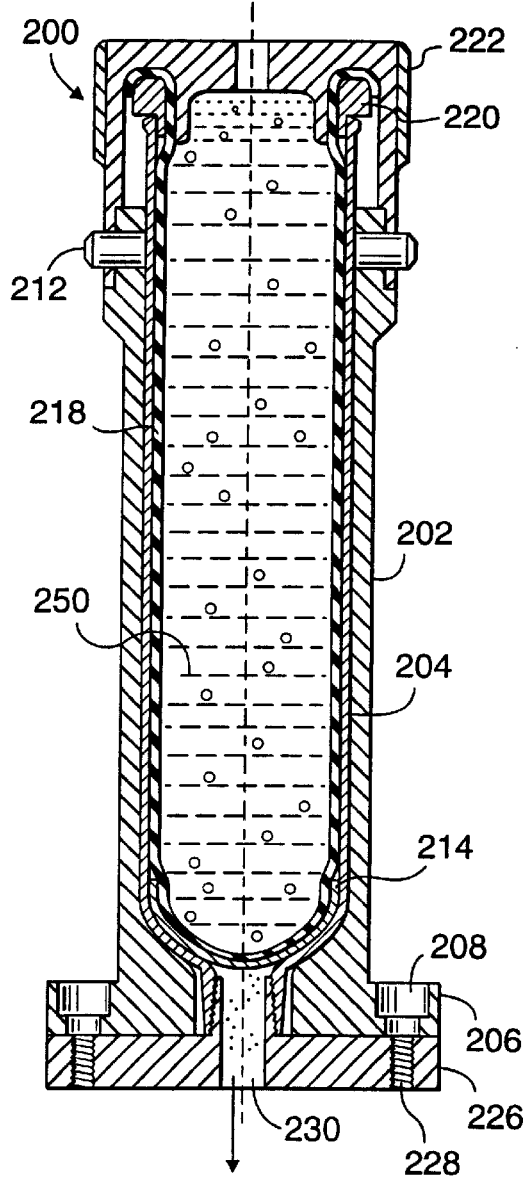
FIG. 7 is a view similar to that of FIG. 6 but showing the contained diaphragm in a selectively expanded and material dispensing position.
Figure 8:
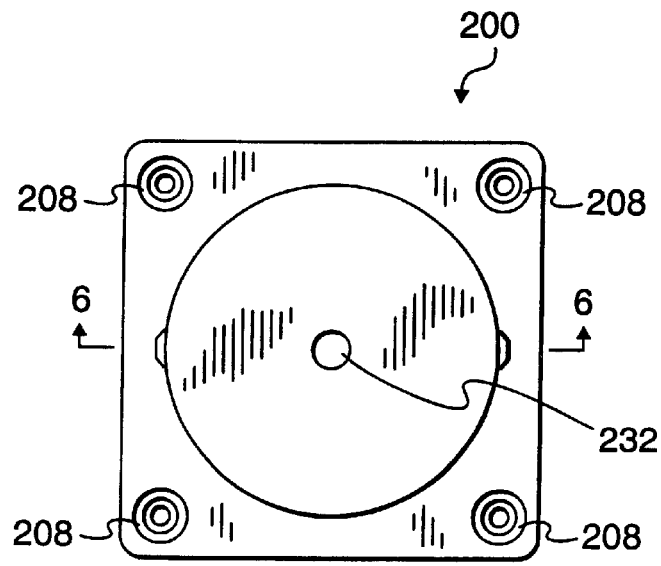
FIG. 8 is a top view of the viscous material dispensing apparatus shown in FIGS. 6 and 7.
Figure 9:
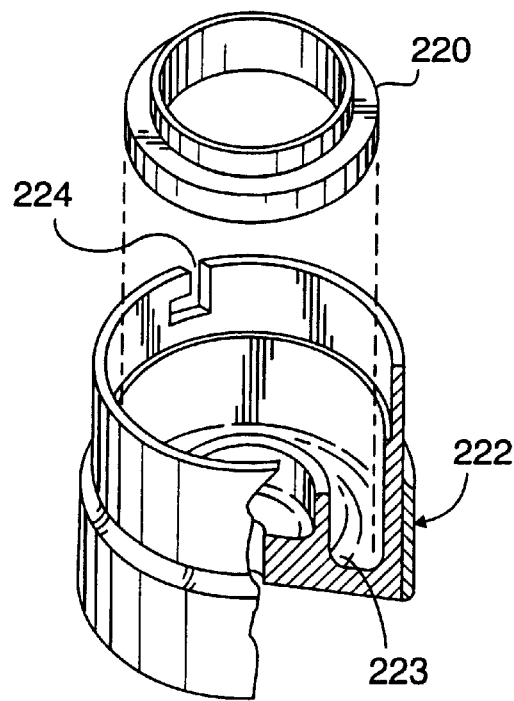
FIG. 9 is a bottom unassembled perspective view of the cap and retaining ring portion of the viscous material dispensing apparatus shown in FIGS. 6 and 7.

Syringe 204 is adapted to be selectively and removably placed within cavity 203. Particularly, syringe 204 contains a ring or projection portion 235 which is adapted to be frictionally and removably deployed within groove 233. Syringe 204 further includes a material containment cavity 205 which generally conforms to cavity 203, and a plunger or selectively moveable viscous material displacement piece 214, which, in one embodiment, is substantially similar in function and structure to displacement piece 34. Particularly, piece 214 is selectively, matably, and movably disposed within syringe cavity 205 between a first position in relative close proximity to the upper opening 215 of syringe 204, as illustrated in FIG. 7, and a second position in relative proximity to the material dispensing aperture 216 which is formed within the syringe 204, which is illustrated in FIG. 8, and which operatively communicates with aperture 230.

Apparatus 200 further includes a selectively expandable and generally tubular shaped membrane or diaphragm 218 having a first closed end portion 219 which operatively engages the generally concave surface 217 of displacement piece 214, and which is manufactured from a relatively thin, flexible and durable material such as latex, butyl rubber or commercially available "Nitrile" material. In one non-limiting embodiment, diaphragm 218 has a thickness ranging from three thousandths of an inch (0.003") to ten thousandths of an inch (0.010"), although other thicknesses may be employed. Particularly, in one non-limiting embodiment, the thickness of diaphragm 218 decreases along its length with the thickness being minimized near the material dispensing aperture 230 of apparatus 200 and maximized near opening 215.

Diaphragm further includes a second open end 225 which is foldably and compressibly secured around a substantially circular retaining ring 220, thereby causing open end 225 to substantially and operatively conform to the shape of ring 220. Ring 220 is selectively, operatively, frictionally and removably contained within an integrally formed and generally circular channel 223 of cap 222, thereby securely positioning diaphragm 218 within syringe cavity 205.

Cap 222 includes a relatively small and generally circular air reception aperture 232 which communicates with the hollow and selectively expandable interior 250 of diaphragm 218, thereby allowing for the introduction of a gaseous material, such as air, to be selectively and expandably communicated to the interior 250 of diaphragm 218. Cap 222 is removably mounted upon housing 202 in a manner which has been previously explained. That is, socket grooves 224, which are similar in function and structure to grooves 24, selectively, removably and cooperatively receive laterally extending posts 212 which are similar in function and structure to posts 22 (see FIG. 1), thereby allowing cap 222 to be selectively and removably secured to housing 202.

When mounted upon housing 202, cap 222 fits snugly and compressibly over retaining ring 220 and diaphragm 218 and supportably positions the ring 220 upon the upper lip 227 of syringe 204, thereby securing diaphragm 218 within housing 202 and causing substantially all of the gas or air which is introduced through opening 232 to travel and be expansively retained within the interior 250 of diaphragm 218.

In operation, mounting piece 226 is selectively placed upon and operatively secured to a print or compression head, such as compression head 6, by use of conventional and commercially available fasteners 210. Air or other gaseous material is selectively introduced into the interior 250 of diaphragm 218 through communicating aperture 232. As the air pressure within diaphragm 218 increases, diaphragm 218 expands forcing plunger 214 towards the bottom of syringe 204, thereby forcing viscous material 100 through communicating apertures 216 and 230, and into the compression head, until plunger 214 reaches its bottom-most position, which is illustrated in FIG. 7. The rate and force at which plunger 214 expels viscous material 100 is selectively controlled in a conventional manner by selectively modifying the pressure introduced through opening 232, such as by way of a conventional pressure regulator.

In such a manner, the selectively expandable diaphragm 218 obviates the need for a relatively large piston assembly to selectively cause material 100 to be desirably dispensed, and concomitantly reduces the overall cost and complexity of the assembly 200.

Figure 10:
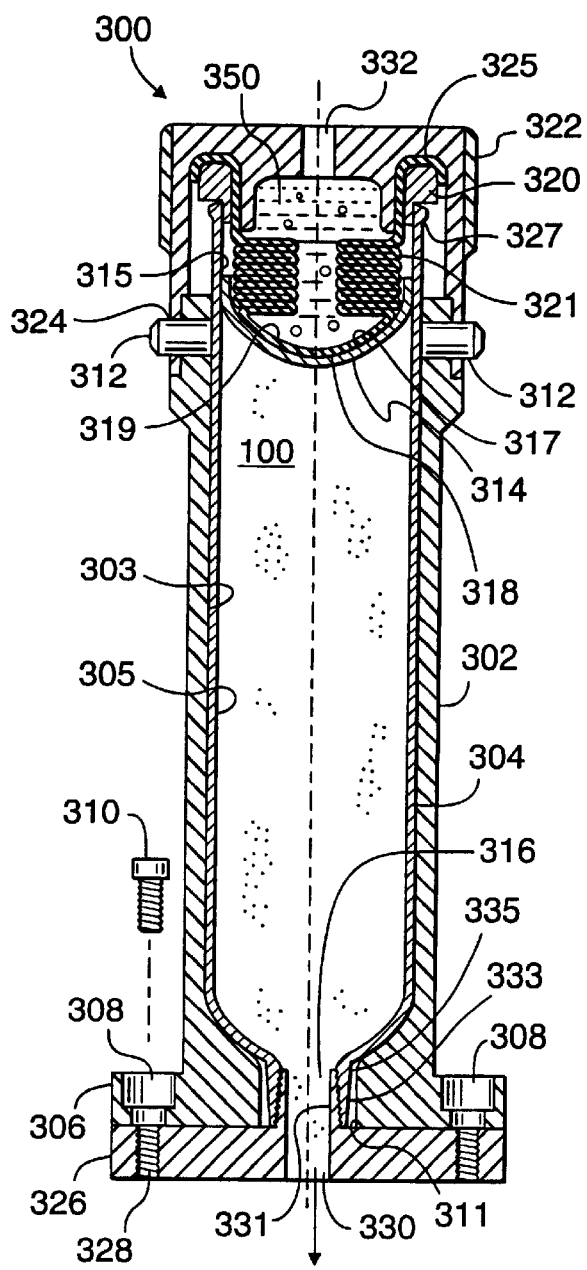
FIG. 10 is a cross-sectional view of a viscous material dispensing apparatus made in accordance with the teachings of an alternate embodiment of the invention and having a selectively expandable diaphragm which is shown in a selectively contracted position.
Figure 11:
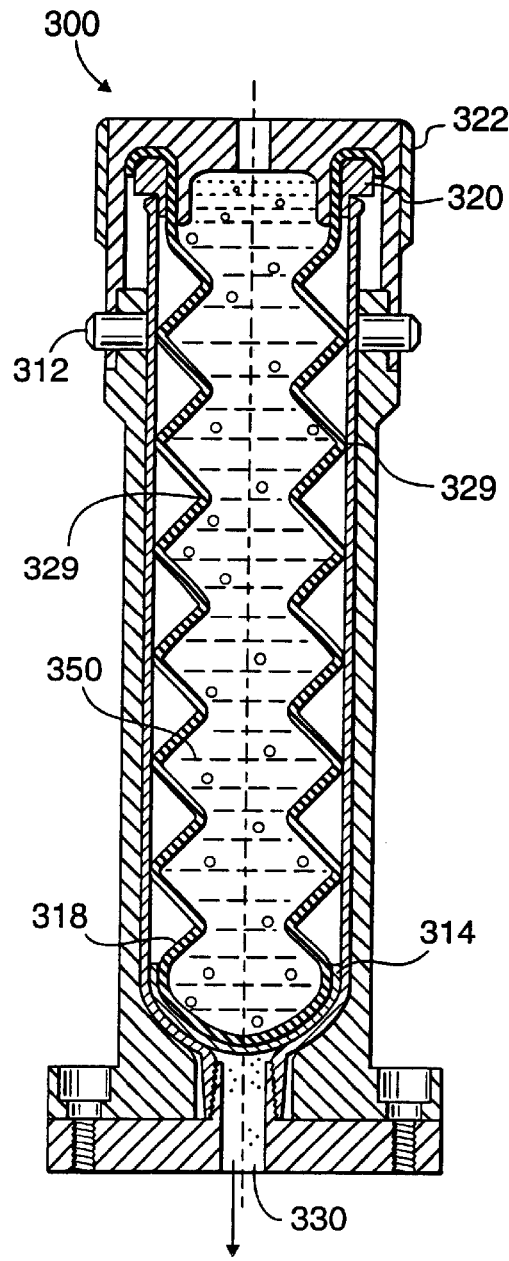
FIG. 11 is a view similar to that of FIG. 10 but showing the contained diaphragm in a selectively expanded and material dispensing position.

Referring now to FIGS. 10 and 11, an apparatus 300 is provided and is made in accordance with the teachings of an alternate embodiment of the invention. Particularly, apparatus 300 is substantially similar to apparatus 200, except that the generally elastic diaphragm 218 has been replaced with a "bellows" type diaphragm 318. With the exception of diaphragm 318, apparatus 300 includes substantially identical components as apparatus 200. Unless otherwise noted, components having a substantially identical structure and function are defined by the same reference numerals as used with respect to apparatus 200, delineated in FIGS. 6 through 9, with the exception that these components will have these reference numerals incremented by 100. In this alternate embodiment, diaphragm 318 is manufactured from a relatively stiff and durable material such as rubber, plastic, metal or a composite and has a plurality of integrally formed "bellows" or selectively expandable pleats 321 which are adapted to selectively and cooperatively expand or contract, thereby expanding and contracting diaphragm 318.

In operation, air or gas is introduced through aperture 332 and into interior 350, thereby causing the pleats 321 to expand at respective, integrally formed and substantially air-tight joints 329. Accordingly, the diaphragm 318 is selectively forced from a compressed or constricted position, as shown in FIG. 10, to a expanded or extended position, as shown in FIG. 11. As diaphragm 318 expands from its compressed to its expanded position, plunger 314 is forced towards the bottom of syringe 304, thereby forcing viscous material 100 through communicating apertures and/or openings 316 and 330 and into the compression head until plunger 314 reaches its bottom-most position, as illustrated in FIG. 11. It should be appreciated that the use of integrally formed and selectively expandable "air-tight" pleats 321 allows diaphragm 318 to be manufactured from a relatively thicker and more durable material than diaphragm 218, thereby resulting in a longer functional life.

Figure 12:
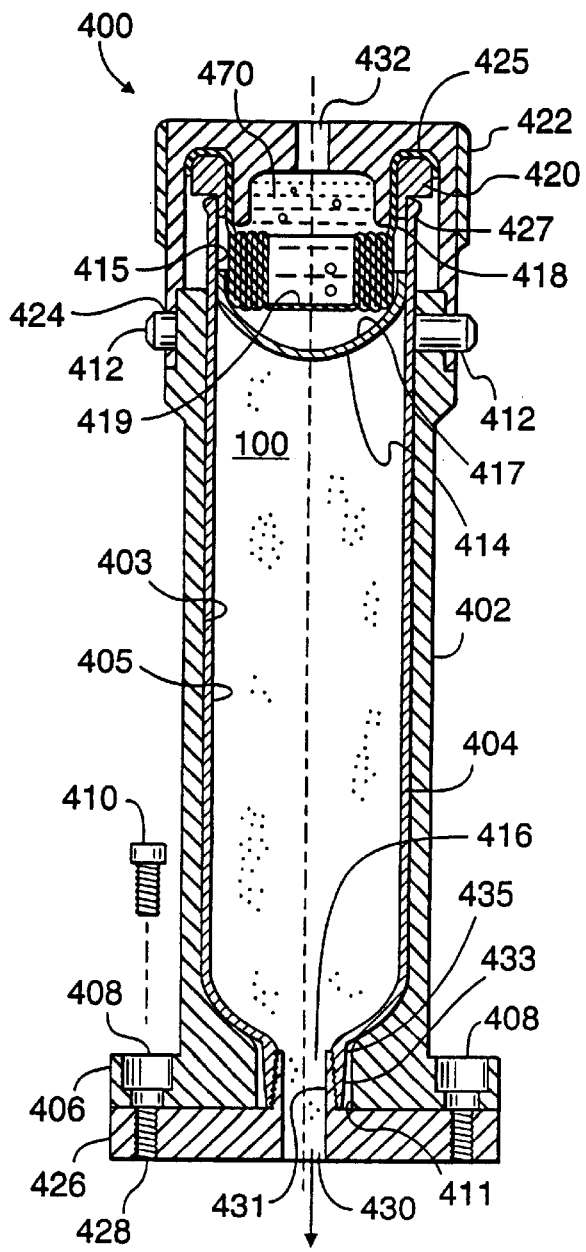
FIG. 12 is a cross-sectional view of a viscous material dispensing apparatus made in accordance with the teachings of another alternate embodiment of the invention and having a selectively expandable diaphragm which is shown in a selectively contracted position.
Figure 13:
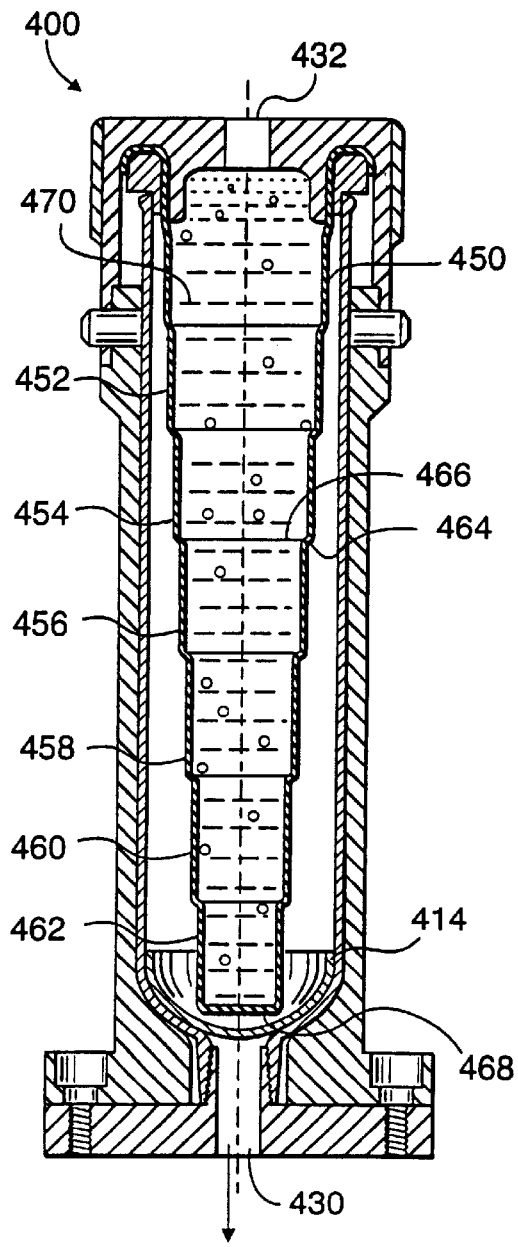
FIG. 13 is a view similar to that of FIG. 12 but showing the contained diaphragm in a selectively expanded and material dispensing position.

In yet another alternate embodiment of the invention, an apparatus 400 for dispensing viscous material is provided. Apparatus 400 is substantially similar to apparatus 200 with the exception that diaphragm 218 has been replaced with a telescopic diaphragm 418, as illustrated in FIGS. 12 and 13. With the exception of diaphragm 418, apparatus 400 includes substantially identical components as apparatus 200. Unless otherwise noted, components having a substantially identical structure and function are defined by the same reference numerals used with respect to apparatus 200, delineated in FIGS. 6 through 9, with the exception that these components will have the reference numerals incremented by 200.

Telescoping diaphragm 418, in one embodiment, is manufactured from a relatively stiff and durable material such as rubber, plastic, metal or a composite. Diaphragm 418 includes integrally formed and overlapping concentric or tubular shaped segments 450–462. Each segment 450–462, in one non-limiting embodiment, is substantially similar and cylindrical in shape and has a diameter which is slightly smaller than the diameter of the preceding segment (e.g., the diameter of segment 462 is slightly smaller than the diameter of segment 460 which is slightly smaller than the diameter of segment 458). Diaphragm 418 includes a plurality of conventional and generally circular rubber or metal seals 464 which reside around the perimeter of each juncture 466 occurring and/or formed between adjacent segments 450–462. Seals 464 provide an air-tight seal at each juncture 466 and cooperate with the "closed" end 468 of segment 462 to substantially prevent the escape of air from diaphragm 418. It should be understood that while a diaphragm having six tubular segments is illustrated in this non-limiting example, any number of segments 450–462 may be used without departing from the scope of the invention.

In operation, gas is introduced through aperture 432 causing the air pressure within the interior 470 of diaphragm 418 to increase, thereby forcing concentric tubular segments 452–462 "downward" toward the bottom (e.g., toward aperture 430) of the assembly 400. As the concentric tubular segments 452–462 are forced "downward", diaphragm 418 expands from a compressed or constricted position, as shown in FIG. 12, to a expanded or extended position, as shown in FIG. 13. As diaphragm 418 expands from its compressed position to its expanded position, plunger 414 is forced towards the bottom of syringe 404, thereby forcing viscous material 100 through opening 416 and central channel 430 and into the compression head, until plunger 414 reaches its bottom-most position, illustrated in FIG. 13. The use of telescoping tubular segments 450–462 allows diaphragm 418 to be manufactured from a relatively thicker and more durable material than diaphragm 218, thereby resulting in a longer functional life.

Figures 14, 15:
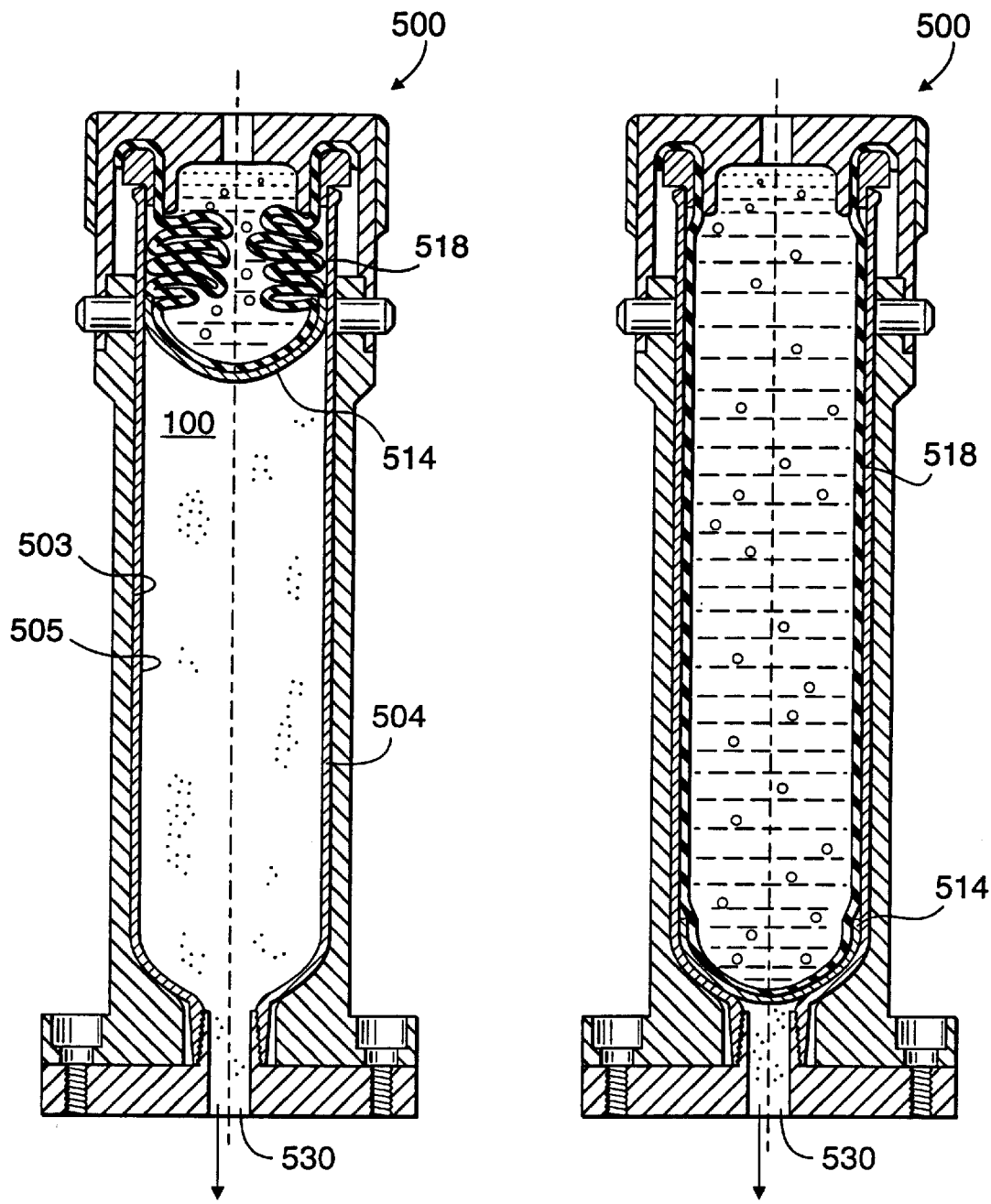
FIG. 14 is a cross-sectional view of a viscous material dispensing apparatus made in accordance with the teachings of yet another alternative embodiment of the invention and having a selectively expandable diaphragm which is shown in a selectively contracted position.
FIG. 15 is a view similar to that of FIG. 14 but showing the contained diaphragm in a selectively expanded and material dispensing position.

In yet another alternate embodiment of the invention, an apparatus 500 for dispensing viscous material is provided and is illustrated in FIGS. 14 and 15. Apparatus 500 is substantially similar to apparatus 200 with the exception that diaphragm 218 has been replaced with diaphragm 518. With the exception of diaphragm 518, apparatus 500 includes substantially identical components as apparatus 200. Unless otherwise noted, components having a substantially identical structure and function are defined by the same reference numerals with respect to apparatus 200, with the exception that these components will have reference numerals incremented by 300.

Particularly, apparatus 500 includes a selectively expandable diaphragm 518 which has a substantially constant and/or uniform cross sectional area and which has a shape, as shown best in FIG. 15, which generally conforms to the syringe cavity 505 even when not filled with air or other gaseous material. Particularly, diaphragm 518 is simply folded to fit within the top of apparatus 500 when material 100 is not to be dispensed. Upon receipt of air or other gases, diaphragm 518 expands and selectively and operatively moves piece 514 within the cylinder cavity 505, effective to cause the material 100 to be selectively emitted from aperture 530.

It is to be understood that the embodiments of the invention which have been described are merely illustrative of some applications of the principles of the invention. Numerous modifications may be made by those skilled in the art without departing from the true spirit and scope of the invention.

What is claimed is:

1. An apparatus for dispensing viscous material, said apparatus comprising:
    a generally elongated housing having an interior cavity and a first dispensing aperture;
    a reservoir which is selectively disposed within said interior cavity, said reservoir containing viscous material and having an interior surface, an upper lip portion and a second dispensing aperture which communicates with said first dispensing aperture;
    a member which is movably disposed within said reservoir and which mates with said interior surface;
    a retaining ring which is disposed upon said upper lip portion of said reservoir;
    an expandable diaphragm having a first portion which is foldably secured around said retaining ring and a second portion which selectively and expandably engages said member and which causes said member to move within said reservoir, thereby causing said contained viscous material to be dispensed through said first and second dispensing apertures; and
    a cap which is selectively and sealingly attached to said housing and which includes a generally circular, integrally-formed interior channel which receives said retaining ring and said first portion of said expandable diaphragm, thereby securely retaining said diaphragm within said reservoir, said cap including an aperture which selectively receives pressurized gas, effective to expand said diaphragm, thereby moving said member within said reservoir and causing said contained viscous material to be dispensed.

2. The apparatus of claim 1 wherein said expandable diaphragm is manufactured from a flexible material.

3. The apparatus of claim 2 wherein said expandable diaphragm is manufactured from rubber.

4. The apparatus of claim 1 wherein said expandable diaphragm includes a plurality of selectively expandable pleats.

5. The apparatus of claim 1 wherein said expandable diaphragm comprises a plurality of concentric telescoping bore segments.

6. The apparatus of claim 1 wherein said housing comprises a pair of laterally extending connector posts, and wherein said cap comprises a pair of grooves which selectively receive said connector posts, thereby allowing said cap to be attached to said housing.

7. An apparatus for dispensing viscous material, said apparatus comprising:
    a generally cylindrical elongated housing having an interior cavity and an integrally formed base portion including a first material dispensing aperture;
    a mounting member which is selectively coupled to said housing and which allows said housing to be selectively mounted upon a structure, said mounting member having a generally flat bottom surface and a hollow raised portion which is selectively disposed within said first material dispensing aperture and which cooperates with said housing to form a retention groove;
    a syringe which is selectively disposed within said interior cavity, said syringe containing viscous material and having an interior surface, an upper lip portion and a projection portion which is frictionally deployed within said retention groove and which forms a second material dispensing aperture which communicates with said first material dispensing aperture;
    a displacement piece which is movably disposed within said syringe and which mates with said interior surface;
    a retaining ring which is disposed upon said upper lip portion of said syringe;
    an expandable diaphragm having a first portion which is secured around said retaining ring and a second portion which selectively and expandably engages said member and which causes said member to move within said syringe, thereby causing said contained viscous material to be dispensed through said first and second material dispensing apertures; and
    a cap which is selectively and sealingly attached to said housing and which includes a generally circular, integrally-formed interior channel which receives said retaining ring and said first portion of said expandable diaphragm, thereby securing said diaphragm within said syringe, said cap including an aperture which selectively receives pressurized gas, effective to expand said diaphragm, thereby moving said member within said syringe and causing said contained viscous material to be dispensed.

8. The apparatus of claim 7 wherein said expandable diaphragm is manufactured from a flexible material.

9. The apparatus of claim 8 wherein said expandable diaphragm is manufactured from rubber.

10. The apparatus of claim 7 wherein said expandable diaphragm includes a plurality of selectively expandable pleats.

11. The apparatus of claim 7 wherein said expandable diaphragm comprises a plurality of concentric telescoping bore segments.

* * * * *